United States Patent
Laermer et al.

(10) Patent No.: US 8,182,707 B2
(45) Date of Patent: May 22, 2012

(54) METHOD FOR ETCHING A LAYER ON A SUBSTRATE

(75) Inventors: Franz Laermer, Weil der Stadt (DE);
Silvia Kronmueller, Schwaikheim (DE);
Tino Fuchs, Tuebingen (DE); Christina Leinenbach, Ensdorf (DE)

(73) Assignee: Robert Bosch GmbH, Stuttgart (DE)

( * ) Notice: Subject to any disclaimer, the term of this patent is extended or adjusted under 35 U.S.C. 154(b) by 719 days.

(21) Appl. No.: 11/658,461

(22) PCT Filed: Jul. 1, 2005

(86) PCT No.: PCT/EP2005/053121
§ 371 (c)(1), (2), (4) Date: Jan. 24, 2007

(87) PCT Pub. No.: WO2006/013137
PCT Pub. Date: Feb. 9, 2006

(65) Prior Publication Data
US 2008/0311751 A1    Dec. 18, 2008

(30) Foreign Application Priority Data
Jul. 29, 2004 (DE) .......................... 10 2004 036 803

(51) Int. Cl.
*B44C 1/22* (2006.01)
*C03C 15/00* (2006.01)
*C03C 25/68* (2006.01)
*C23F 1/00* (2006.01)

(52) U.S. Cl. .......................................... 216/58; 216/72
(58) Field of Classification Search ............ 257/E21.299
See application file for complete search history.

(56) References Cited

U.S. PATENT DOCUMENTS

| | | |
|---|---|---|
| 2002/0153808 A1 | 10/2002 | Skotnicki et al. |
| 2003/0141561 A1* | 7/2003 | Fischer et al. .............. 257/415 |
| 2003/0215989 A1 | 11/2003 | Kim et al. |
| 2004/0235262 A1 | 11/2004 | Lee et al. |
| 2005/0157093 A1 | 7/2005 | Murai |
| 2005/0191795 A1 | 9/2005 | Chidambarrao et al. |
| 2005/0199970 A1* | 9/2005 | Monfray et al. .............. 257/414 |

FOREIGN PATENT DOCUMENTS

| | | |
|---|---|---|
| DE | 42 41 045 | 5/1994 |
| DE | 44 20 962 | 12/1995 |

(Continued)

OTHER PUBLICATIONS

Gregory T. A. Kovacs et al., Bulk Micromachining of Silicon, Aug. 1990, IEEE, vol. 86, No. 8, 1543-1544.*

(Continued)

*Primary Examiner* — Nadine G Norton
*Assistant Examiner* — Stephanie Duclair
(74) *Attorney, Agent, or Firm* — Kenyon & Kenyon LLP

(57) ABSTRACT

A method for etching a layer that is to be removed on a substrate, in which a $Si_{1-x}Ge_x$ layer is the layer to be removed, this layer being removed, at least in areas, in gas phase etching with the aid of an etching gas, in particular $ClF_3$. The etching behavior of the $Si_{1-x}Ge_x$ layer can be controlled via the Ge portion in the $Si_{1-x}Ge_x$ layer. The etching method is particularly well-suited for manufacturing self-supporting structures in a micromechanical sensor and for manufacturing such self-supporting structures in a closed hollow space, because the $Si_{1-x}Ge_x$ layer, as a sacrificial layer or filling layer, is etched highly selectively relative to silicon.

24 Claims, 3 Drawing Sheets

FOREIGN PATENT DOCUMENTS

| | | |
|---|---|---|
| DE | 195 37 814 | 4/1997 |
| DE | 198 47 455 | 4/2000 |
| DE | 19847455 | 4/2000 |
| DE | 100 06 035 | 8/2001 |
| DE | 101 42 952 | 12/2002 |
| DE | 103 02 676 | 7/2004 |
| FR | 2 857 952 | 1/2005 |
| FR | 2857952 | 1/2005 |
| GB | 1180187 | 2/1970 |
| JP | 1-92385 | 4/1989 |
| JP | 4-208528 | 7/1992 |
| JP | 2002-200599 | 7/2002 |
| JP | 2004-15050 | 1/2004 |
| SG | 127690 | 12/2006 |
| WO | WO 0023376 A1 * | 4/2000 |
| WO | WO 2004/063969 | 6/2004 |
| WO | WO 2004/070338 | 8/2004 |
| WO | WO 2004/108585 | 12/2004 |

OTHER PUBLICATIONS

S. Borel et al, Isotropic Etching og SiGE Alloys with High Selectivity, Mar. 14, 2004, Microelectronic Engineering, vol. 73-47, 301-305.*

Machine Translation of Becker et al (WO 0023376 A1).*

Borel, S. et al., "Isotropic etching of SiGe alloys with high selectivity to similar materials", Microelectronic Engineering, Elevier Publishers BV., Amsterdam, NL, vol. 73-74, Jun. 2004, pp. 301-305.

* cited by examiner

METHOD FOR ETCHING A LAYER ON A SUBSTRATE

FIELD OF THE INVENTION

The present invention relates to a method for etching a layer that is to be removed on a substrate.

BACKGROUND INFORMATION

A selective removal of a particular layer, such as for example a sacrificial layer, on a semiconductor substrate is a conventional measure in methods for manufacturing a semiconductor component, in particular in a method for manufacturing self-supporting structures. Thus, in the method for manufacturing a micromechanical sensor, a sacrificial layer is formed on the substrate, and on this layer another structured layer is deposited and structured. Subsequently, the sacrificial layer is selectively removed in order to expose the structures. In principle, the sacrificial layer can be removed using dry-chemical or wet-chemical methods.

German Patent Application No. DE 195 37 814 describes a sensor and a method for manufacturing a sensor in which on a silicon substrate a thermal oxide is first deposited, onto which a thin layer of highly doped polysilicon is then applied for use as a buried printed conductor. Another oxide layer is then deposited on the polysilicon layer, and for example a thick epipolysilicon layer is then deposited thereon. After this, the deposition and structuring of a surface aluminum metallization then takes place. Finally, the sensor structures that are to be exposed are etched free, preferably using a fluorine-based silicon deep etching method, described in German Patent No. DE 42 41 045. The exposure of the sensor element takes place using a sacrificial layer etching in which the oxide is typically removed under the sensor areas using media containing hydrofluoric acid, in a vapor etching method. A disadvantage of this underetching technique is that the oxide is removed not only under the sensor area that is to be exposed, but also above this area, and partially also under the polysilicon printed conductors, so that there is a danger of leakage paths and leakage currents. Protection of the oxide areas whose underetching is to be prevented, e.g., by protective lacquer, is possible only at a considerable expense, because vaporous hydrofluoric acid very quickly penetrates almost all practical polymer protective layers, and in addition can have a strongly corrosive effect.

The problems resulting from the use of vaporous hydrofluoric acid can be avoided by using a plasma etching method to carry out the underetching of the sensor elements. Thus, German Patent No. DE 44 20 962 describes a dry etching method in silicon is proposed in order to manufacture sensor structures in which, through a combination of anisotropic and isotropic plasma etching techniques, a subsequent wet-etching step or an etching in the vapor phase can be omitted. A separate sacrificial layer is not provided. All process steps can be carried out in a single plasma etching installation. For this purpose, first, again with the aid of the anisotropic deep etching method described in German Patent No. DE 42 41 045, the sensor structure is produced with vertical walls. Here, deposition steps in which a Teflon-type polymer is deposited on the side wall alternate with fluorine-based etching steps that are isotropic in themselves but are made locally anisotropic during the etching through the driving forward of the side wall polymer. Subsequently, a fluorine-based etching step is used to isotropically etch the silicon substrate until the silicon structure for the sensor element is completely exposed.

However, this method has two serious disadvantages. On the one hand, as a result of what is known as the "micro-loading effect," narrow etched trenches are etched more slowly than are broad etched trenches, and this also holds for the speed of the subsequent lateral underetching; i.e., the underetching proceeds more slowly in narrow trenches than in broad trenches. On the other hand, the structures that are to be exposed are also attacked from their underside or floor. This has the result that structures that are surrounded by broad trenches have a smaller residual height than do structures that are surrounded by narrow trenches, which often results in non-reproducible and unsatisfactory mechanical properties of the manufactured sensor elements.

In order to enable a defined underetching, and thus to remove the disadvantages of the method described in German Patent No. DE 44 20 962, the method described in German Patent Application No. DE 198 47 455 A1 can be used. Here as well, a combination of anisotropic plasma etching for the structuring of the sensor elements and subsequent underetching thereof using isotropic gas phase etching or isotropic fluorine plasma etching makes it possible to do away entirely with hydrofluoric acid vapor. However, in this method an oxide layer that is only a few tens of nanometers thick is used as a separating layer directly above a polysilicon sacrificial layer in the area of the sensor structure that is to be produced. An epipolysilicon layer is deposited on the thin oxide layer and is structured using the anisotropic deep etching method described in German Patent No. DE 42 41 045. Here the thin oxide layer acts as a hard etch stop that is subsequently itself removed by a plasma etching using fluorine-rich etching gases such as $CF_4$ or $C_2F_6$, under intense ion bombardment, i.e., using a high substrate bias voltage. Subsequently, the side walls of the sensor structures are coated with a Teflon-type polymer or an Si oxide thin layer as a protective layer, before the structured elements, made of epipolysilicon, are exposed by isotropic gas phase underetching, e.g., using $ClF_3$, or also by an isotropic fluorine plasma underetching. Due to the high selectivity of this etching step of at least 200-300:1 relative to silicon oxide, the oxide layer on the underside of the structured elements, and possibly also on the side walls, prevents etching thereof on the rear side, or lateral etching attack.

However, the oxide on the rear side induces a pressure voltage and an upward curvature of the structure elements. From this there results a lasting influence of the oxide on the mechanical characteristics of the structure elements. In order to minimize this disturbing effect, the oxide layer should be as thin as possible, approximately 10 nm. In addition, practice has shown that the Teflon-type protective layer, or any type of protective layer, on the structure side walls is often not sufficient to prevent etching attack thereof during the isotropic gas phase or plasma etching step. Even an oxide layer in place of the Teflon passivation, applied in a cost-intensive deposition method, is not sufficient to ensure the necessary process reliability. After the exposure of the sensor structure, this oxide layer is then to be removed again at the structure side walls, for which reason the problematic effect of hydrofluoric acid or hydrofluoric acid vapor then finally applies.

SUMMARY

An example method according to the present invention is based on the fact that a layer of a silicon-germanium alloy can be deposited on a substrate in a gas phase etching with the aid of an etching gas, in particular in highly selective fashion relative to a substrate made of silicon. In particular, it is proposed to use $ClF_3$ as a particularly advantageous etching gas. The etching behavior of the $Si_{1-x}Ge_x$ layer can be controlled via the Ge portion in the alloy.

If a $Si_{1-x}Ge_x$ layer is in particular used as a sacrificial layer in order to manufacture a micromechanical sensor and the sacrificial layer is removed by gas phase etching, the above-described disadvantages with respect to the removal of the sacrificial layer are avoided. The example method according to the present invention can do entirely without an etching of a silicon oxide layer by media containing hydrofluoric acid, so that an undesirable but unavoidable etching of protective layers above or below polysilicon printed conductors does not take place. There is thus no danger of leakage paths and leakage currents. The process reliability is also improved in that there is no longer a dependence on side wall protective layers, because in the etching method according to the present invention a very high selectivity, resulting from the material, of the structured layer to the sacrificial layer is present.

In addition, a $Si_{1-x}Ge_x$ layer can also be deposited on a substrate as a filling layer, and can be removed by a gas phase etching in a simple manner in order to produce a hollow space after a deposition of a capping layer on the substrate.

BRIEF DESCRIPTION OF THE DRAWINGS

Exemplary embodiments of the present invention are shown in the figures, and are explained in detail below.

FIG. 1 shows, in sectional view, a micromechanical sensor element before the removal of the $Si_{1-x}Ge_x$ sacrificial layer.

FIG. 2 shows, in sectional view, this element after the removal of this layer.

FIG. 3 shows, in sectional view, a micromechanical sensor element before the removal of the $Si_{1-x}Ge_x$ sacrificial layer.

FIG. 4 shows, in sectional view, this element after the removal of this layer.

FIG. 5 shows, in sectional view, a micromechanical sensor element before the removal of the $Si_{1-x}Ge_x$ sacrificial layer and the $Si_{1-x}Ge_x$ filling layer.

FIG. 6 shows, in sectional view, this element after the removal of this layer.

DETAILED DESCRIPTION OF EXAMPLE EMBODIMENTS

Figure 1:
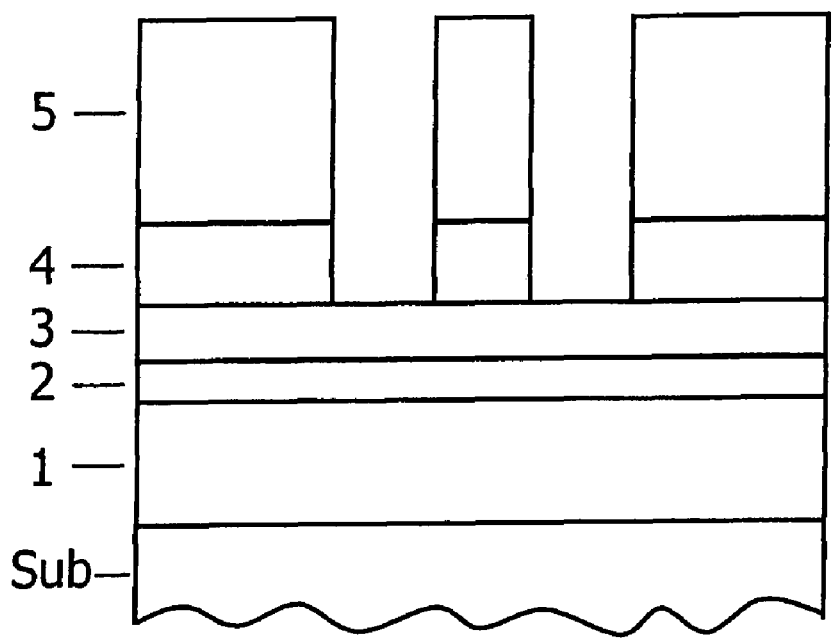
FIGS. 1 and 2 show an example method according to the present invention for the selective etching of a layer on a substrate.

An example method according to the present invention is first demonstrated for the example of a manufacturing process of a micromechanical sensor. In order to manufacture the layer system shown in FIG. 1, first a first insulating layer 1, typically a thick thermal insulating oxide, is deposited on a silicon substrate Sub. A possible thickness for this oxide layer is in the range of a few micrometers, e.g. 2.5 μm.

Over this, a conductive layer 2 is applied, preferably a thin polysilicon layer having a thickness of approximately 0.5 μm. However, other layer materials are also possible; for example, insulating layer 1 can also be made of other oxides, silicon nitride, or other insulating layers. For conductive layer 2, besides polysilicon other metallic layers are also suitable, as long as materials are selected that are uncritical for the subsequent high-temperature steps, such as e.g., tungsten or tungsten alloys. Conductive layer 2, which, as described above, is made of polysilicon, is doped by doping from the gas phase ($POCl_3$), a high degree of conductivity being sought here. All other processes for producing a sufficiently highly doped polysilicon layer can also be used.

A structuring of conductive layer 2 then takes place using a photolithographic process. In this way, conductive layer 2 is divided into individual areas insulated from one another, which can for example act as printed conductors or electrodes.

A second insulating layer 3 is then deposited on the substrate Sub. For the deposition of this layer, conventional deposition processes from the semiconductor technology for the depositing of dielectric layers can be used. Besides silicon dioxide, silicon nitride, various glasses, or other ceramic layers can thus be deposited. For the further description, it is assumed that second insulating layer 3 is also made of silicon oxide.

Next, a $Si_{1-x}Ge_x$ layer 4 is deposited on second insulating layer 3. The thickness of $Si_{1-x}Ge_x$ layer 4 is a few micrometers, e.g. 1.5 μm. The content of germanium in the $Si_{1-x}Ge_x$ alloy can be varied as needed; a possible value range for x is the range of x=0.05 to x=0.5, in particular x=0.1 to x=0.5. In the case of x=0.5, the portions of germanium and silicon in the overall alloy are equally large. For particular applications, a value range having a smaller upper boundary value for x, for example a range of x=0.05 to x=0.3, in particular x=0.1 to x=0.3, can be suitable. The dependence of the melting point of the SiGe alloy on the Ge portion is important. As the Ge portion increases, the melting point decreases. For x=1, i.e., Ge itself, the melting point is 940° C. For x=0, i.e., Si itself, the melting point is 1414° C. Correspondingly, the melting point of the $Si_{1-x}Ge_x$ alloy for x=0.05 to x=0.5 moves between these values: it must be compatible with the subsequent high-temperature steps.

As a final layer, a thick silicon layer 5 is applied onto $Si_{1-x}Ge_x$ layer 4. Preferably, as silicon layer 5 a polysilicon layer is deposited epitaxially; this is known as epipoly-Si. Specifically, first a polysilicon start layer covers the surface of $Si_{1-x}Ge_x$ layer 4, and acts as a nucleus for the subsequent deposition. Through a corresponding doping process, for example implantation or the driving in of doping materials from the gas phase, a doping that may be required of the polysilicon start layer is ensured. For the deposition of the polysilicon start layer, all standard methods in semiconductor technology for depositing thin polysilicon layers are suitable.

The deposition of the actual silicon layer 5 then takes place in a further process step. This deposition takes place in an epitaxy reactor. An epitaxy reactor of this sort is an installation for depositing silicon layers that are used in semiconductor technology in order to produce monocrystalline silicon layers on a monocrystalline silicon substrate. The deposition of such layers takes place as a rule at temperatures of more than 1000° C., and in this way layer thicknesses on the order of magnitude of a few tens of micrometers can be achieved. Because in the present process the deposition in the epitaxy reactor takes place not on a monocrystalline silicon substrate but rather on the polycrystalline silicon start layer, a monocrystalline silicon layer is not formed; rather, a thick polycrystalline silicon layer 5, known as epipolysilicon, is formed, designated thick silicon layer 5 hereinafter. The deposition conditions with which the polycrystalline silicon start layer is produced can influence the crystalline properties of thick silicon layer 5. In addition, the strong doping of the polysilicon start layer effects a doping of thick silicon layer 5 starting from the underside. In addition, during the growth of thick silicon layer 5, and in a subsequent doping process after the growth, there takes place a further doping of thick silicon layer 5. The subsequent doping of thick silicon layer 5 can in turn take place through implantation, doping from the gas phase, or any other conventional doping process from the semiconductor technology. In this process, the polysilicon start layer becomes part of thick silicon layer 5. In the area of contact holes (not shown in FIGS. 1 and 2), thick silicon layer 5 makes immediate contact to conductive layer 2.

Figure 2:
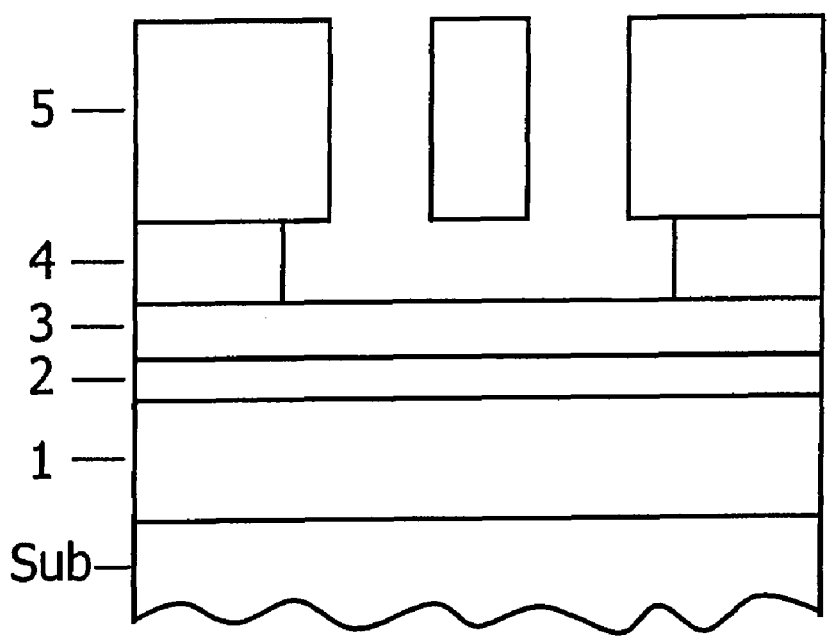

On the upper side of thick silicon layer 5, another metallic layer is then applied and structured (not shown in FIGS. 1 and 2 for clarity). The metallic layer can for example be applied over the entire surface and subsequently structured.

In another photolithographic process, a structuring of thick silicon layer 5 then takes place, as is shown in FIG. 1. For this purpose, on the upper side of silicon layer 5 a mask, e.g., a photomask, is applied, which also protects the metallic layer in the subsequent etching. Through openings through the photoresist mask, a deep etching method based on fluorine then for example takes place in separate alternating successive etching and polymerization steps, as recited in the teaching of DE 42 41 045 C1. Through this deep etching process, trenches having a high aspect ratio, i.e., large depth and small lateral dimension, can be produced.

The trenches extend from the upper side of thick silicon layer 5 to the upper side of second insulating layer 3. In this way, silicon layer 5 is divided into individual areas that are insulated from one another, to the extent that they are not connected to one another via conductive layer 2.

According to an example embodiment of the present invention, in a gas phase etching, an etching gas is then brought into contact with $Si_{1-x}Ge_x$ layer 4 through the trenches, and the etching gas effects a highly selective etching of $Si_{1-x}Ge_x$ layer 4. Besides $BrF_3$ and $XeF_2$, $ClF_3$ is preferably used as an etching gas. In this combination—i.e., $ClF_3$ as an etching gas and a layer of $Si_{1-x}Ge_x$ that is to be removed—the extraordinarily high selectivity relative to epipolysilicon is approximately 4000:1, and relative to $SiO_2$ it is approximately 100,000:1. In practice, it has further been determined that here the etching behavior, in particular the speed of etching, can be controlled extremely effectively via the portion of germanium in the alloy. The greater the portion of germanium in the $Si_{1-x}Ge_x$ alloy, up to values of approximately x=0.3 as an upper limit, the faster the etching. From a Ge portion of approximately 30 percent, i.e., in a range from x=0.3 to x=0.5, the etching speed remains almost constant. In sum, in this way an etching attack is enabled that is controlled, i.e., whose etching speed is controllable and whose material combination is highly selective.

After removal of parts of $Si_{1-x}Ge_x$ layer 4 under the structured sensor element made of epipolysilicon, this sensor element is completely underetched, and thus exposed, as is shown in FIG. 2.

During the etching of the sacrificial layer, contact pads (not shown in FIG. 2) made of a metal such as aluminum can advantageously be protected by the same photoresist mask that was previously used as a protective mask during the anisotropic plasma etching. Thus, the completely dry process scheme provides not only a reduced risk of corrosion but also a complete protection of the aluminum contact pads by the photoresist mask, previously used as a trench mask.

After lock out from an etching installation, the photoresist mask and the remaining Teflon-type side wall films are removed from substrate Sub in an oxygen plasma stripper. This incineration process using an oxygen plasma is a known measure in the semiconductor industry for removing residual lacquer and process residue from previous plasma etching steps.

Figure 3:
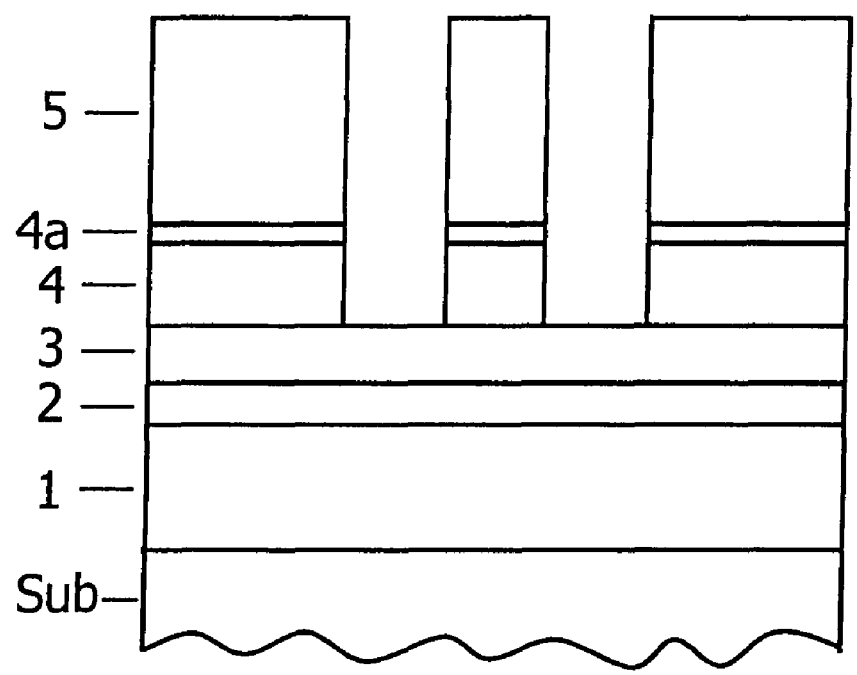
FIGS. 3 and 4 show a second example relating to the layer construction of a sensor element.
Figure 4:
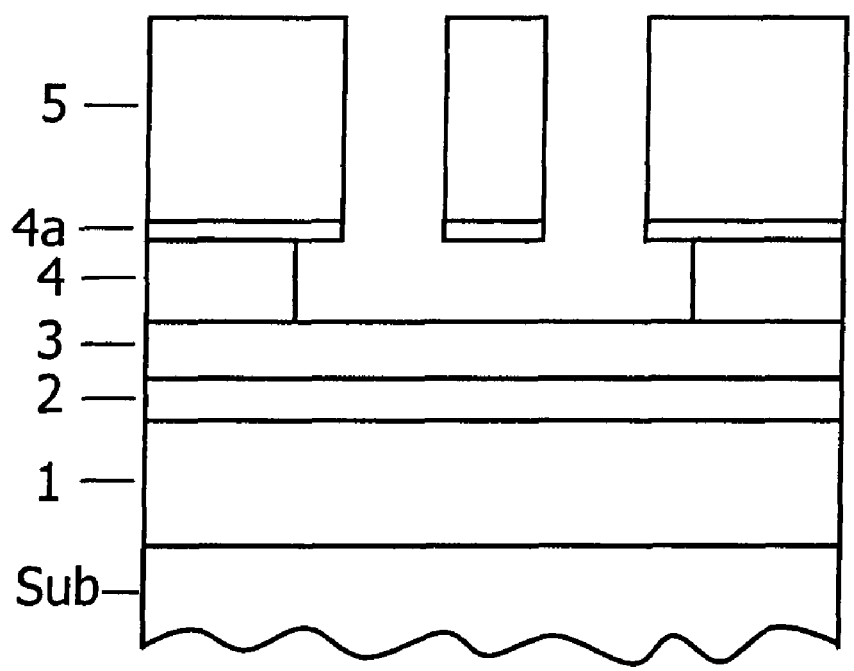

A particularly advantageous example embodiment of the etching method according to an example embodiment of the present invention is shown in FIGS. 3 and 4. Supplementing the previously described construction of the micromechanical sensor, a diffusion barrier 4a is provided between $Si_{1-x}Ge_x$ layer 4 and upper Si layer 5. Diffusion barrier 4a prevents germanium from diffusing out into upper Si layer 5. Diffusion barrier 4a is a thin Si oxide layer or an Si nitride layer, typically having a thickness of only 10 to 100 nm. Such a thin layer of silicon oxide or silicon nitride is sufficient because here it acts as a diffusion barrier, but does not have to ensure a passivation relative to an etching gas, in particular $ClF_3$.

Figure 5:
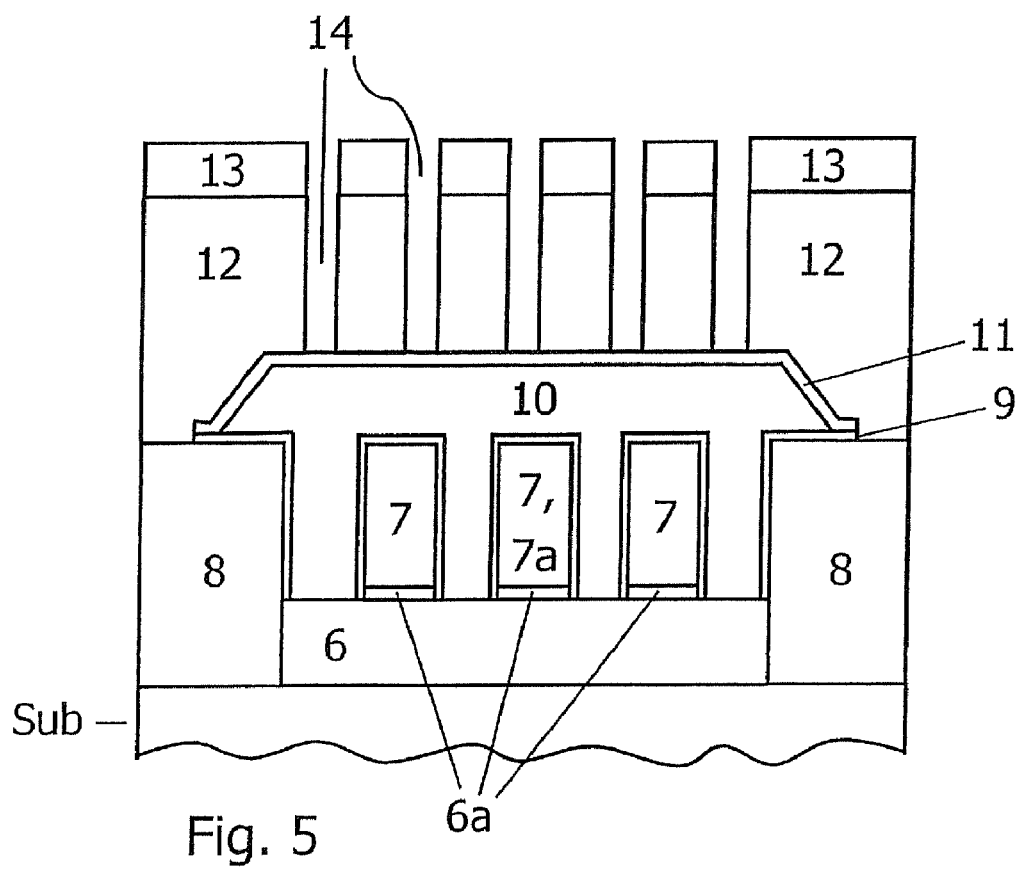
FIGS. 5 and 6 show a third example relating to the layer construction of a sensor element.
Figure 6:
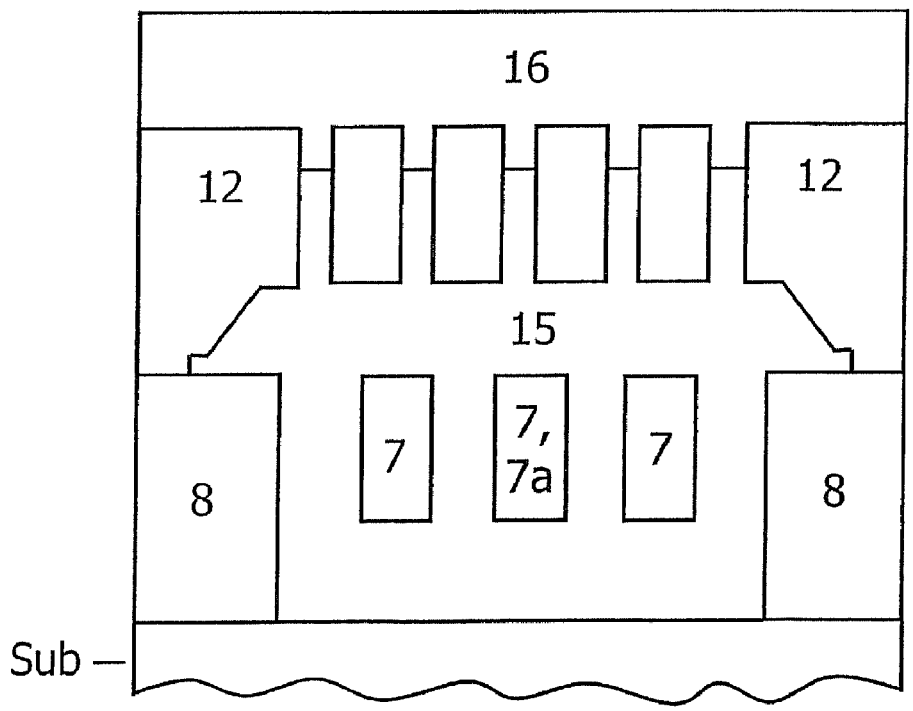

In another exemplary embodiment, the example method according to the present invention can be used in the manufacture of a micromechanical component having at least one hollow space with a movable structure. Generally, as is shown in FIGS. 5 and 6, two $Si_{1-x}Ge_x$ layers are deposited, as a sacrificial layer or filling layer respectively, onto a substrate in an area having sensor elements, and are removed after a deposition of a capping layer onto the substrate, in order to produce a hollow space.

Specifically, corresponding to, for example, German Patent Application No. DE 100 06 035, in the manufacture of the sensor a first sacrificial layer is deposited on a substrate Sub, and a silicon layer 7 is deposited thereon, and is subsequently structured to form sensor elements. In this example, center sensor element 7a will form a movable structure after the end of the process. However, in contrast to the conventional method from the named reference, it is proposed to deposit as the first sacrificial layer not silicon oxide but rather, according to the present invention, a $Si_{1-x}Ge_x$ layer 6. Through a pre-structuring of the sacrificial layer, during the deposition and structuring of silicon layer 7 anchorings to the substrate Sub, called support structures 8, can also be produced. Preferably, even before the deposition of silicon layer 7, a diffusion barrier 6a for germanium is deposited from an oxide onto $Si_{1-x}Ge_x$ layer 6. As was described in connection with the first exemplary embodiment, the oxide layer typically has a thickness of only 10 to 100 nm. For a passivation relative to an etching gas, in particular $ClF_3$, need not be ensured by diffusion barrier 6a. Only the passage of Ge atoms, in the subsequent high-temperature process steps, through the diffusion barrier in the form of the thin oxide layer, and subsequent penetration into the silicon layer, should be prevented, because this diffusion could destroy the selectivity to $Si_{1-x}Ge_x$ layer 6.

Subsequently, a first thin protective layer 9, preferably made of silicon oxide, is deposited so as to cover the side surfaces of the sensor elements as well as possible. Protective layer 9 likewise has a thickness of only 10 to 100 nm, because here as well it acts as a diffusion barrier against the passage of germanium from the $Si_{1-x}Ge_x$ layer into the adjacent Si layer, but need not ensure a passivation relative to an etching gas, in particular $ClF_3$. A covering of the first sacrificial layer by first protective layer 9 can be omitted.

In the next step, an additional $Si_{1-x}Ge_x$ layer 10 is applied onto the structured sensor elements covered by protective layer 9. This $Si_{1-x}Ge_x$ layer 10 acts as a second sacrificial layer, and is what is known as a filling layer. The thickness of the filling layer is chosen so that the later sensor elements are completely covered by it. Typically, the thickness of the filling layer is approximately 5 to 30 μm. After the deposition of the filling layer, a structuring of the filling layer is carried out in such a way that the filling layer is left standing in areas in which the later sensor elements will be situated. The filling layer is removed over support structures 8, except for silicon oxide protective layer 9.

A second protective layer 11, preferably made of silicon oxide, is applied onto the structured filling layer. Like first protective layer 9, second protective layer 11 can also be very thin. A thickness of approximately 10 to 100 nm is sufficient to prevent germanium from diffusing out into the still-to-be-applied upper silicon layer 12. Second protective layer 11 is removed in areas over support structures 8 in such a way that the two protective layers 9, 11 on support structures 8 blend together, or are situated together in sealing fashion.

Finally, on second protective layer 11 a polysilicon layer 12 is deposited that acts as a capping layer 12. Capping layer 12 is provided with a lacquer or oxide mask 13 and is structured using an Si deep etching method. In this way, capping layer 12 is provided with perforations 14 that end at second protective layer 11. With the aid of perforations 14, a suitable etching medium can be supplied to the layers that are to be removed. Here, first the second protective layer 11, and then the filling layer, the first sacrificial layer, and first protective layer 9 are removed. In order to remove the filling layer and the sacrificial layer of $Si_{1-x}Ge_x$ 6, an etching gas, in particular $ClF_3$, is supplied to perforations 14, thus creating a direct access to the filling layer. At the end of the process, both the filling layer and also the first sacrificial layer of $Si_{1-x}Ge_x$ 6 have been completely removed, or removed at least in some areas around the sensor elements, so that a hollow space 15 results that has at least one movable sensor element 7a.

As can be seen in FIG. 6, following this etching step the perforations 14 are sealed by a covering layer 16. Covering layer 16 is preferably between approximately 1 and 20 μm thick, and is made for example of an insulating material, preferably silicon oxide.

Through the method described above, in a simple manner a hollow space 15 is created having movable sensor elements 7a on a substrate Sub. In principle, the method can be used at any time to create a hollow space 15 on a substrate, hollow space 15 being produced by using an etching gas to remove a filling layer of $Si_{1-x}Ge_x$. Hollow space 15 can have movable and/or non-movable sensor elements, or can also be used for other purposes without having any sensor elements.

In addition to the exemplary applications described above of the method according to an example embodiment of the present invention for manufacturing a micromechanical sensor using a sacrificial or filling layer of $Si_{1-x}Ge_x$ the proposed etching method can also be used whenever an etching, controllable in a defined manner, of a layer or substrate is necessary or desired. Thus, a layer or substrate made of a silicon-germanium alloy is possible in which the content of germanium in the alloy is varied in a particular direction, for example over the thickness of the layer, in order to achieve in a targeted manner a varying etching speed in gas phase etching. A layer sequence of a plurality of individual layers having different germanium content is also suitable to enable a selective etching. In the extreme case, an etch stop can be achieved in this way.

What is claimed is:

1. A method for etching a layer that is to be removed on a silicon substrate, comprising:
   providing a $Si_{1-x}Ge_x$ layer on the substrate, wherein x is between 0.05 and 0.5;
   growing and structuring a silicon layer on the $Si_{1-x}Ge_x$ layer;
   providing an oxide layer or nitride layer between the $Si_{1-x}Ge_x$ layer and the silicon layer, the oxide layer or nitride layer having a thickness of 10 to 100 nm as a diffusion barrier or protective layer; and
   removing the $Si_{1-x}Ge_x$ layer at least in areas in gas phase etching using an etching gas;
   wherein the oxide layer or nitride layer prevent the passage of germanium from the $Si_{1-x}Ge_x$ layer into the silicon layer,
   wherein the etching gas includes $BrF_3$.

2. The method as recited in claim 1, wherein the $Si_{1-x}Ge_x$ layer is already present on the substrate, or is deposited on the substrate.

3. The method as recited in claim 1, further comprising:
   controlling an etching characteristic of the $Si_{1-x}Ge_x$ layer via a Ge portion of the $Si_{1-x}Ge_x$.

4. The method as recited in claim 1, wherein the $Si_{1-x}Ge_x$ layer has a Ge portion having a value x from a value range of x=0.1 to x=0.5.

5. The method as recited in claim 1, wherein the $Si_{1-x}Ge_x$ layer has a Ge portion having a value x from a value range of x=0.05 to x=0.3.

6. The method as recited in claim 5, wherein the $Si_{1-x}Ge_x$ layer has a Ge portion having a value x from a value range of x=0.1 to x=0.3.

7. The method as recited in claim 1, further comprising:
   removing the $Si_{1-x}Ge_x$ layer at least in areas under Si structures that are to be exposed, as a sacrificial layer or filling layer.

8. The method as recited in claim 7, wherein the structuring of the silicon layer is carried out using a fluorine-based deep etching method, in separate alternating successive etching and polymerization steps.

9. The method as recited in claim 1, wherein the silicon layer is an epitaxially grown poly-Si layer.

10. The method as recited in claim 1, wherein the $Si_{1-x}Ge_x$ layer is deposited on the substrate, the substrate being coated with a first insulating layer, a conductive layer, and a second insulating layer.

11. The method as recited in claim 10, wherein the first insulating layer is an $SiO_2$ layer formed thermally on the substrate.

12. The method as recited in claim 10, wherein the conductive layer is a poly-Si layer, the poly-Si layer being applied and structured.

13. The method as recited in claim 10, wherein the second insulating layer is an oxide layer.

14. The method as recited in claim 1, wherein the $Si_{1-x}Ge_x$ layer is deposited as a filling layer in an area having sensor elements, and, in order to produce a hollow space, is removed after a deposition of a capping layer onto the substrate.

15. The method as recited in claim 14, wherein the capping layer is provided with perforations through which the etching gas is brought to the $Si_{1-x}Ge_x$ layer.

16. The method as recited in claim 1, wherein the oxide layer or nitride layer does not prevent the passage of $BrF_3$ from the $Si_{1-x}Ge_x$ layer into the silicon layer.

17. A method for etching a layer that is to be removed on a silicon substrate, comprising:
   providing a $Si_{1-x}Ge_x$ layer on the substrate, wherein x is between 0.05 and 0.5;
   growing and structuring a silicon layer on the $Si_{1-x}Ge_x$ layer;
   providing an oxide layer or nitride layer between the $Si_{1-x}Ge_x$ layer and the silicon layer, the oxide layer or nitride layer having a thickness of 10 to 100 nm as a diffusion barrier or protective layer; and
   removing the $Si_{1-x}Ge_x$ layer at least in areas in gas phase etching using an etching gas;
   wherein the oxide layer or nitride layer prevent the passage of germanium from the $Si_{1-x}Ge_x$ layer into the silicon layer,
   wherein the etching gas includes $ClF_3$.

18. The method as recited in claim 17, further comprising:
removing the $Si_{1-x}Ge_x$ layer at least in areas under Si structures that are to be exposed, as a sacrificial layer or filling layer.

19. The method as recited in claim 18, wherein the structuring of the silicon layer is carried out using a fluorine-based deep etching method, in separate alternating successive etching and polymerization steps.

20. The method as recited in claim 17, wherein the silicon layer is an epitaxially grown poly-Si layer.

21. The method as recited in claim 17, wherein the $Si_{1-x}Ge_x$ layer is deposited on the substrate, the substrate being coated with a first insulating layer, a conductive layer, and a second insulating layer.

22. The method as recited in claim 17, wherein the $Si_{1-x}Ge_x$ layer is deposited as a filling layer in an area having sensor elements, and, in order to produce a hollow space, is removed after a deposition of a capping layer onto the substrate.

23. The method as recited in claim 17, wherein the oxide layer or nitride layer does not prevent the passage of $ClF_3$ from the $Si_{1-x}Ge_x$ layer into the silicon layer.

24. A method for etching a layer that is to be removed on a silicon substrate, comprising:
- providing a $Si_{1-x}Ge_x$ layer on the substrate, wherein x is between 0.05 and 0.5, wherein the $Si_{1-x}Ge_x$ layer is already present on the substrate, or is deposited on the substrate;
- prior to the removal, growing and structuring a silicon layer on the $Si_{1-x}Ge_x$ layer having silicon regions with trenches in between, wherein gas phase etching takes place through the trenches;
- providing at least one of (a) an oxide layer and (b) a nitride layer between the $Si_{1-x}Ge_x$ layer and the silicon layer, the at least one of (a) the oxide layer and (b) the nitride layer having a thickness of 10 to 100 nm as a diffusion barrier or protective layer; and
- following exposure of the silicon regions, removing the $Si_{1-x}Ge_x$ layer in gas phase etching using an etching gas at least in areas under the silicon regions that are to be exposed, as a sacrificial layer.

* * * * *